(12) United States Patent
Doo

(10) Patent No.: US 8,865,554 B2
(45) Date of Patent: Oct. 21, 2014

(54) METHOD FOR FABRICATING NONVOLATILE MEMORY DEVICE

(71) Applicant: SK hynix Inc., Gyeonggi-do (KR)

(72) Inventor: Hyun-Sik Doo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 122 days.

(21) Appl. No.: 13/717,383

(22) Filed: Dec. 17, 2012

(65) Prior Publication Data

US 2014/0045311 A1 Feb. 13, 2014

(30) Foreign Application Priority Data

Aug. 13, 2012 (KR) ........................ 10-2012-0088475

(51) Int. Cl.
*H01L 21/336* (2006.01)
*H01L 27/115* (2006.01)
*H01L 29/66* (2006.01)

(52) U.S. Cl.
CPC .... *H01L 29/66833* (2013.01); *H01L 27/11582* (2013.01); *H01L 29/66666* (2013.01)
USPC ............ 438/287; 257/E21.001; 257/E21.002; 257/E21.04

(58) Field of Classification Search
CPC ............ H01L 27/11582; H01L 29/792; H01L 29/7926; H01L 21/28282; H01L 29/66833; H01L 29/66666; H01L 21/28273; G11C 16/0483

USPC .......... 438/269, 287; 257/E21.001, E21.002, 257/E21.04

See application file for complete search history.

(56) References Cited

U.S. PATENT DOCUMENTS

| 7,994,011 | B2 | 8/2011 | Park et al. | |
|---|---|---|---|---|
| 2011/0260237 | A1 | 10/2011 | Lee et al. | |
| 2011/0266611 | A1 * | 11/2011 | Kim et al. | 257/324 |
| 2012/0049267 | A1 * | 3/2012 | Jung | 257/324 |

* cited by examiner

*Primary Examiner* — Michelle Mandala
(74) *Attorney, Agent, or Firm* — IP & T Group LLP

(57) ABSTRACT

A method for fabricating a nonvolatile memory device includes forming a structure having a plurality of first interlayer insulating layers and a plurality of sacrificial layers alternately stacked over a substrate, forming main channel holes configured to penetrate the structure, sequentially forming a preliminary charge trap layer, a tunnel insulating layer, and a channel layer on the inner walls of the main channel holes, forming a trench configured to penetrate the plurality of sacrificial layers on both sides of each of the main channel holes, and forming insulating oxide layers by oxidizing the preliminary charge trap layer on inner sides of the first interlayer insulating layers. In accordance with this technology, since the charge trap layer is separated for each memory cell, the spread of charges may be prevented and the reliability of a nonvolatile memory device may be improved.

20 Claims, 11 Drawing Sheets

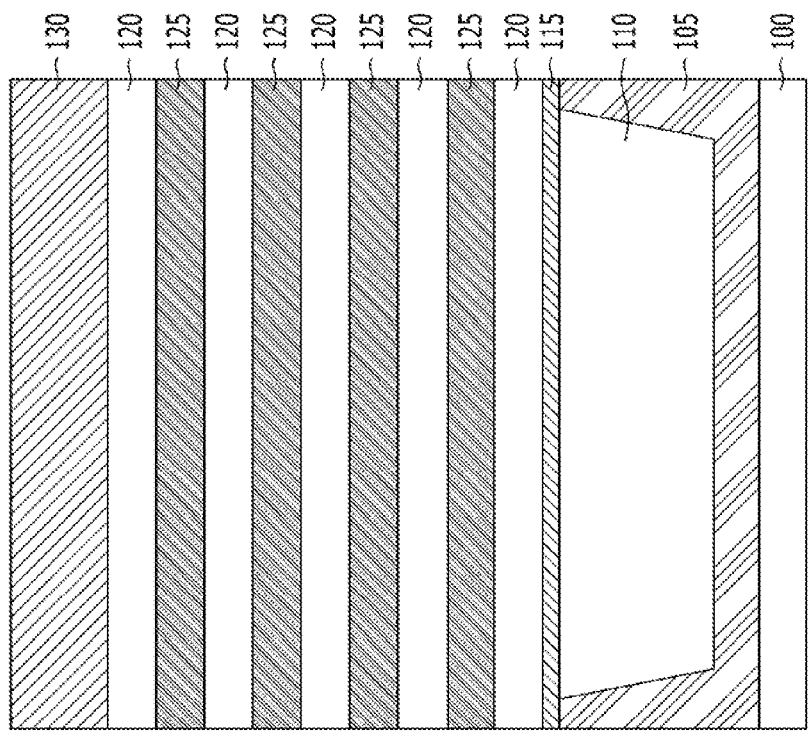
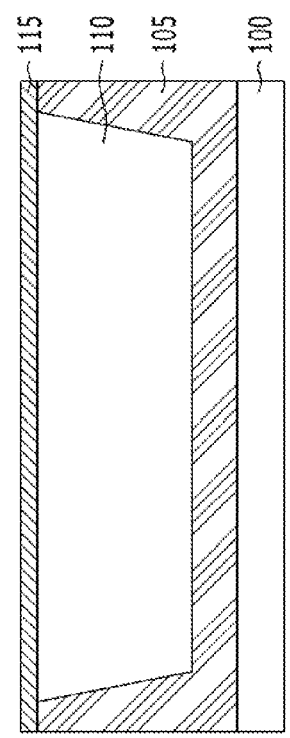
FIG. 1B
FIG. 1A

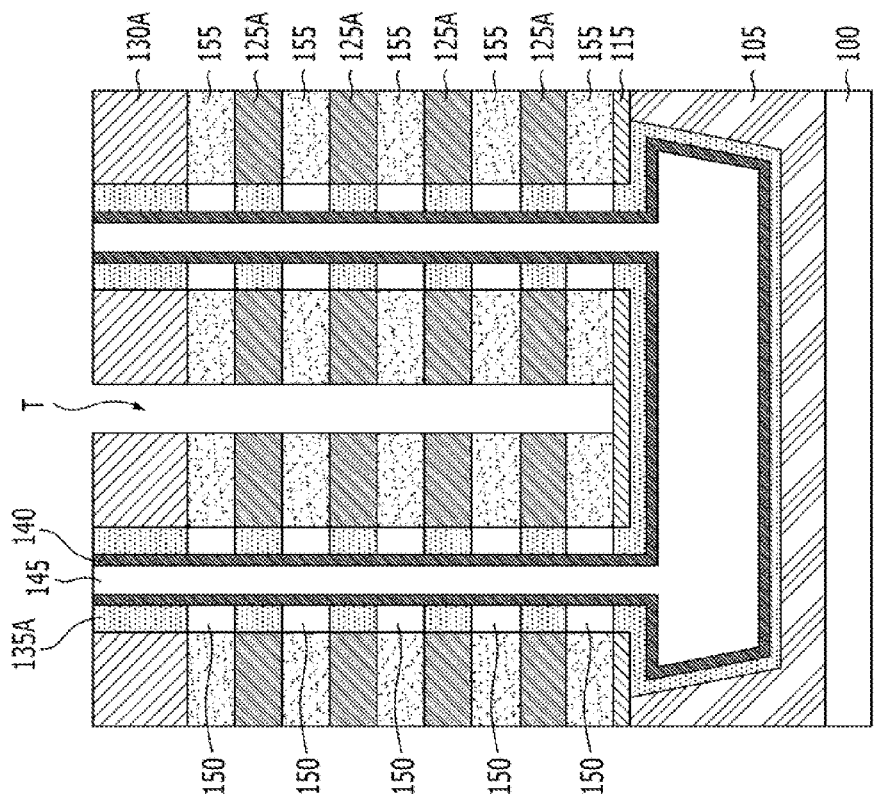
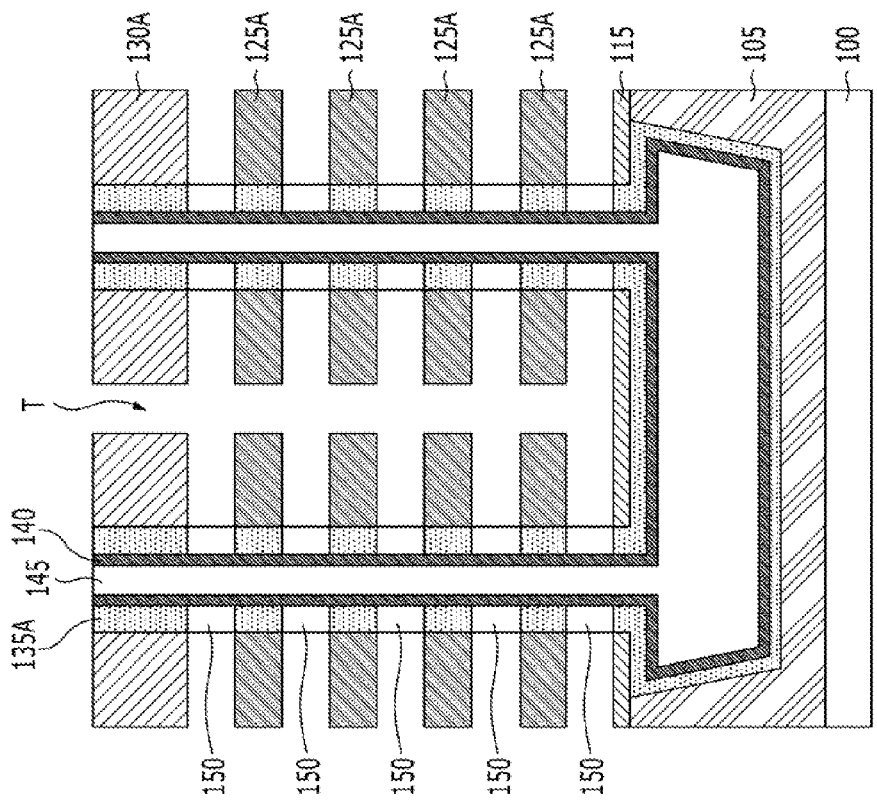

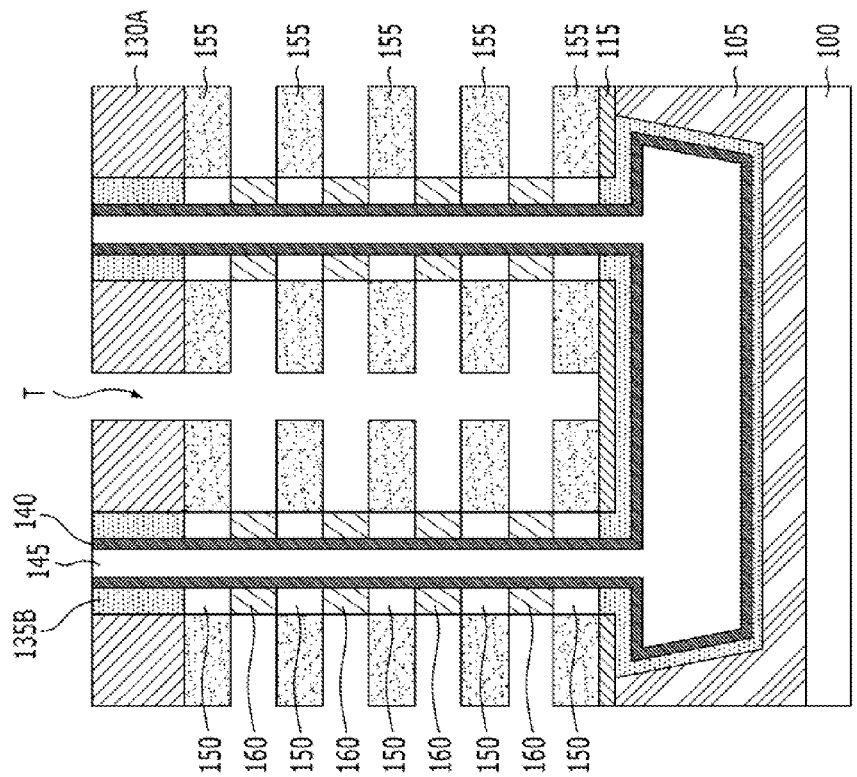
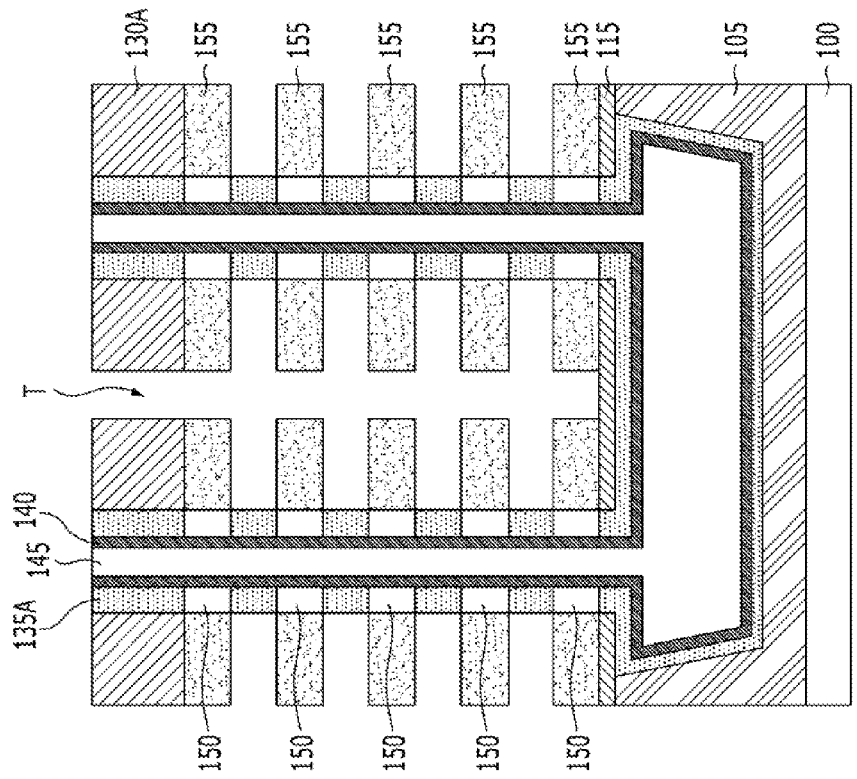

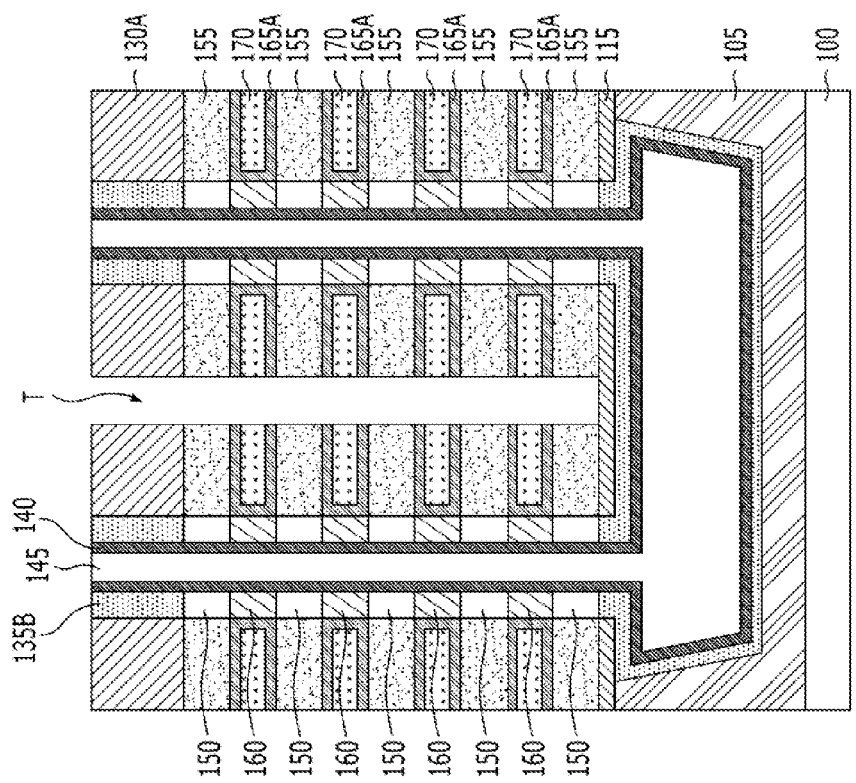
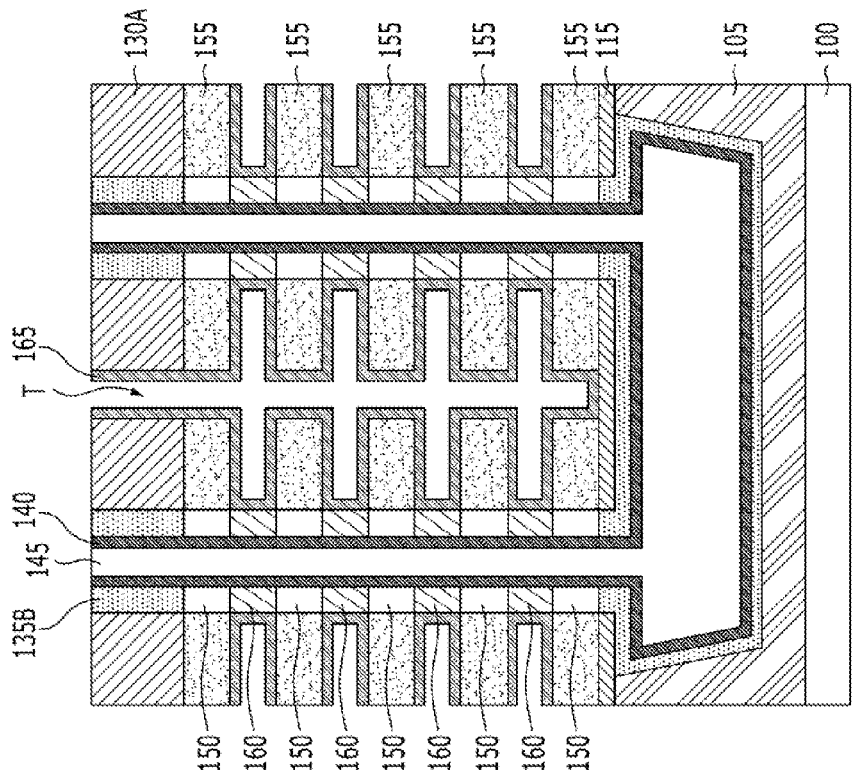

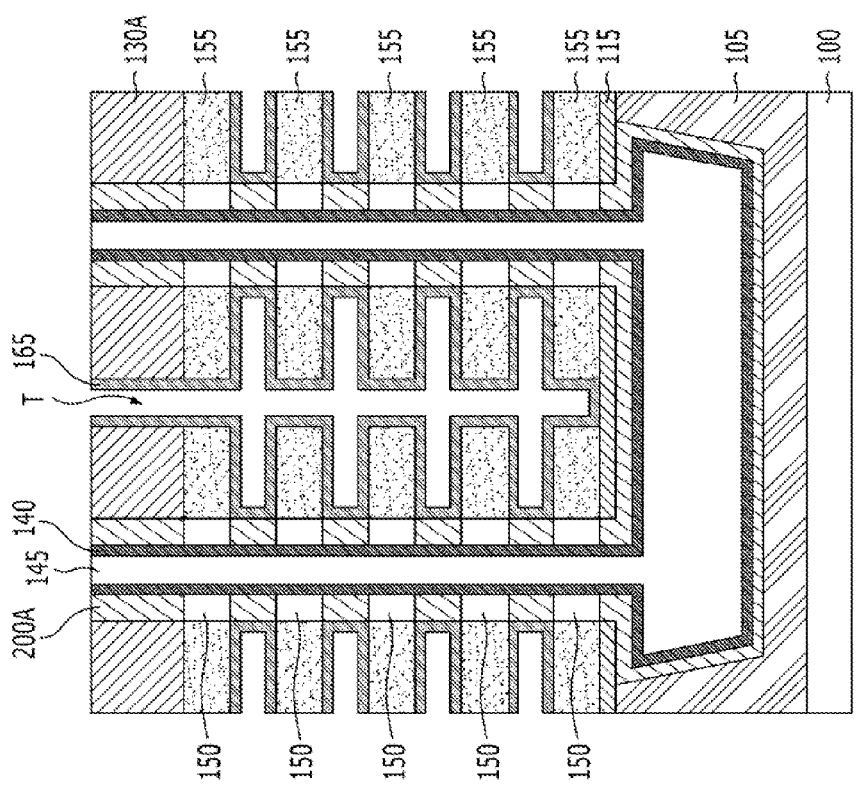
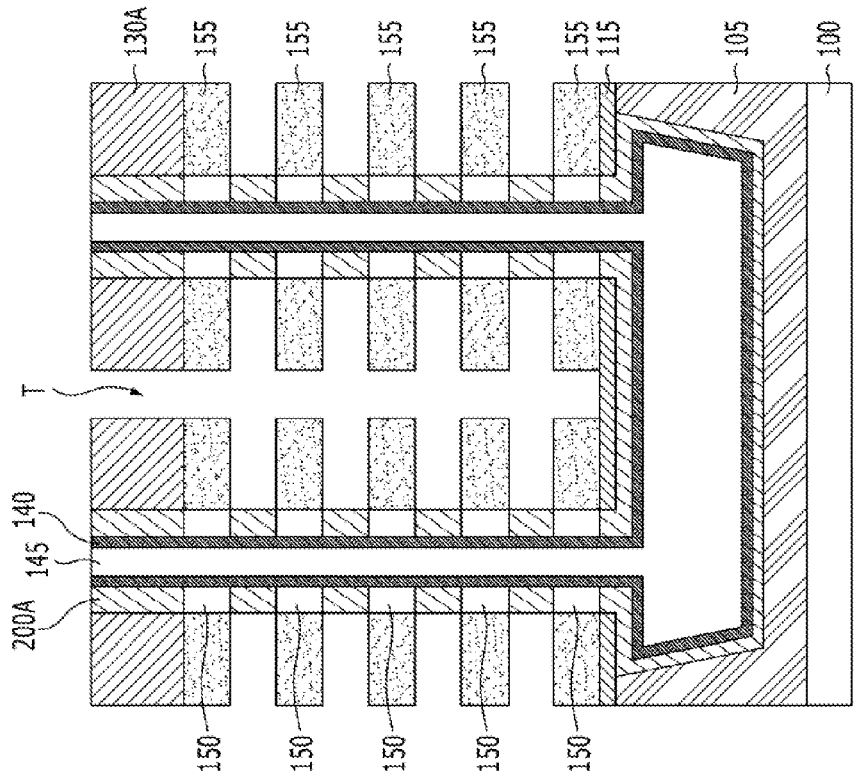

METHOD FOR FABRICATING NONVOLATILE MEMORY DEVICE

CROSS-REFERENCE TO RELATED APPLICATIONS

The present application claims priority of Korean Patent Application No. 10-2012-0088475, filed on Aug. 13, 2012, which is incorporated herein by reference in its entirety.

BACKGROUND

1. Field

Exemplary embodiments of the present invention relate to methods for fabricating a nonvolatile memory device, and more particularly, to methods for fabricating a three-dimensional (3-D) structured nonvolatile memory device in which a plurality of memory cells are stacked over a substrate in a vertical direction.

2. Description of the Related Art

A nonvolatile memory device retains stored data although the power is not supplied. A variety of nonvolatile memory devices, such as flash memory, are being widely used.

As the improvement of the degree of integration of two-dimensional (2-D) structured nonvolatile memory devices with memory cells that are formed over a semiconductor substrate in the form of a single layer has reached the limit, there has been proposed a 3-D structured nonvolatile memory device in which a plurality of memory cells is formed along channel layers in a vertical direction over a semiconductor substrate. More particularly, the 3-D structured nonvolatile memory device includes a structure in which charges are stored in floating gate electrodes made of a conductive material and a structure in which charges are stored in charge trap layers made of an insulating material.

In conventional art, charge trap layers are formed across a plurality of memory cells along a channel layer during a manufacturing process. For this reason, charges trapped to store data may be spread nearby along the charge trap layers, which may deteriorate the reliability of a nonvolatile memory device.

SUMMARY

Exemplary embodiments of the present invention is directed to a method for fabricating a nonvolatile memory device having improved reliability by preventing the spread of charges by separating charge trap layers by memory cells.

In accordance with an embodiment of the present invention, a method for fabricating a nonvolatile memory device may include forming a structure having a plurality of first interlayer insulating layers and a plurality of sacrificial layers alternately stacked over a substrate, forming main channel holes configured to penetrate the structure, sequentially forming a preliminary charge trap layer, a tunnel insulating layer, and a channel layer on the inner walls of the main channel holes, forming a trench configured to penetrate the plurality of sacrificial layers on both sides each of the main channel holes, and forming insulating oxide layers by oxidizing the preliminary charge trap layer on inner sides of the first interlayer insulating layers.

In accordance with another embodiment of the present invention, a method for fabricating a nonvolatile memory device may include forming a pipe connection gate electrode, having a sacrificial pattern, over a substrate, forming a structure having a plurality of first interlayer insulating layers and a plurality of sacrificial layers alternately stacked over the pipe connection gate electrode, forming a pair of main channel holes through which the sacrificial pattern is exposed by selectively etching the structure, forming a sub-channel hole configured to couple with the pair of main channel holes by removing the sacrificial pattern, sequentially forming a preliminary charge trap layer, a tunnel insulating layer, and a channel layer on the inner walls of the pair of main channel holes and the sub-channel hole, forming a trench configured to penetrate the plurality of sacrificial layers on both sides of each of the pair of the main channel holes, and forming insulating oxide layers by oxidizing the preliminary charge trap layer on the inner sides of the first interlayer insulating layers.

BRIEF DESCRIPTION OF THE DRAWINGS

FIGS. 1A to 1M are cross-sectional views illustrating a nonvolatile memory device and a method for fabricating the same in accordance with a first embodiment of the present invention.

FIGS. 2A to 2I are cross-sectional views illustrating a nonvolatile memory device and a method for fabricating the same in accordance with a second embodiment of the present invention.

DETAILED DESCRIPTION

Figure 1D:
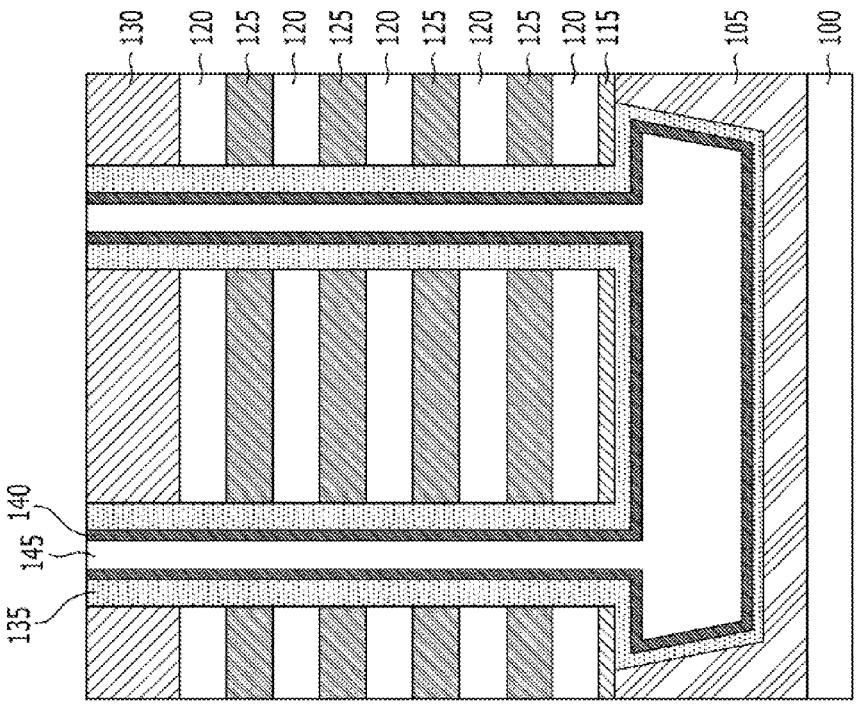

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIGS. 1A to 1M are cross-sectional views illustrating a nonvolatile memory device and a method for fabricating the same in accordance with a first embodiment of the present invention. In particular, FIG. 1M is a cross-sectional view illustrating the nonvolatile memory device in accordance with the first embodiment of the present invention, and FIGS. 1A to 1L are cross-sectional views illustrating an example of intermediate processes for fabricating the nonvolatile memory device of FIG. 1M.

Referring to FIG. 1A, a first pipe connection gate electrode layer 105 is formed over a substrate 100. The substrate 100 may be a semiconductor substrate, such as single crystalline silicon, and the substrate 100 may include specific under structures (not shown). Furthermore, the first pipe connection gate electrode layer 105 may be formed by depositing a conductive material, for example, doped polysilicon or metal.

After forming a groove by selectively etching the first pipe connection gate electrode layer 105, a sacrificial pattern 110 buried in the groove is formed.

The sacrificial pattern 110 is removed in a subsequent process, thus functioning to provide a space where sub-channel hole will be formed. The sacrificial pattern 110 may include a material that has an each rate different from an etch rate of a second pipe connection gate electrode layer, a first interlayer insulating layer, and a sacrificial layer (to be described later) and the first pipe connection gate electrode layer 105. Furthermore, the sacrificial pattern 110 may have an island form that has a long axis in the direction of this cross section and a short axis in a direction crossing the cross section. A plurality of the sacrificial patterns 110 may be arranged in a matrix form when viewed from a plane parallel to the substrate 100.

Next, a second pipe connection gate electrode layer 115 is formed on the first pipe connection gate electrode layer 105 and the sacrificial pattern 110. The second pipe connection gate electrode layer 115 may be formed by depositing a conductive material, for example, doped polysilicon or metal, and may have substantially the same material as the first pipe connection gate electrode layer 105. Meanwhile, the first and the second pipe connection gate electrode layers 105 and 115 are the gate electrodes of pipe connection transistors and may be separated for each block. The first and the second pipe connection gate electrode layers 105 and 115 may surround the sacrificial pattern 110.

Referring to FIG. 1B, a plurality of first interlayer insulating layers 120 and a plurality of sacrificial layers 125 are alternately stacked over the second pipe connection gate electrode layer 115. A structure in which the plurality of first interlayer insulating layers 120 and the plurality of sacrificial layers 125 are alternately stacked is hereinafter called a stack structure, for convenience of description.

The first interlayer insulating layers 120 may be disposed at the bottom and bottom of the stack structure, and the first interlayer insulating layers 120 may have an oxide-based material. Furthermore, the sacrificial layer 125 is removed in a subsequent process, thus providing a space where gate electrodes to be described later will be formed. The sacrificial layer 125 may have a material that has an etch rate different from an etch rate of the first interlayer insulating layers 120, for example, a nitride-based material. Meanwhile, this cross section is illustrated as including four sacrificial layers 125, but this is only illustrative. The number of sacrificial layers 125 may be greater than or less than 4.

A hard mask layer 130 is formed over the stack structure. The hard mask layer 130 may include a nitride-based material, polysilicon, an amorphous carbon layer (ACL), or a bottom anti-reflective coating (BARC) layer.

Figure 1C:
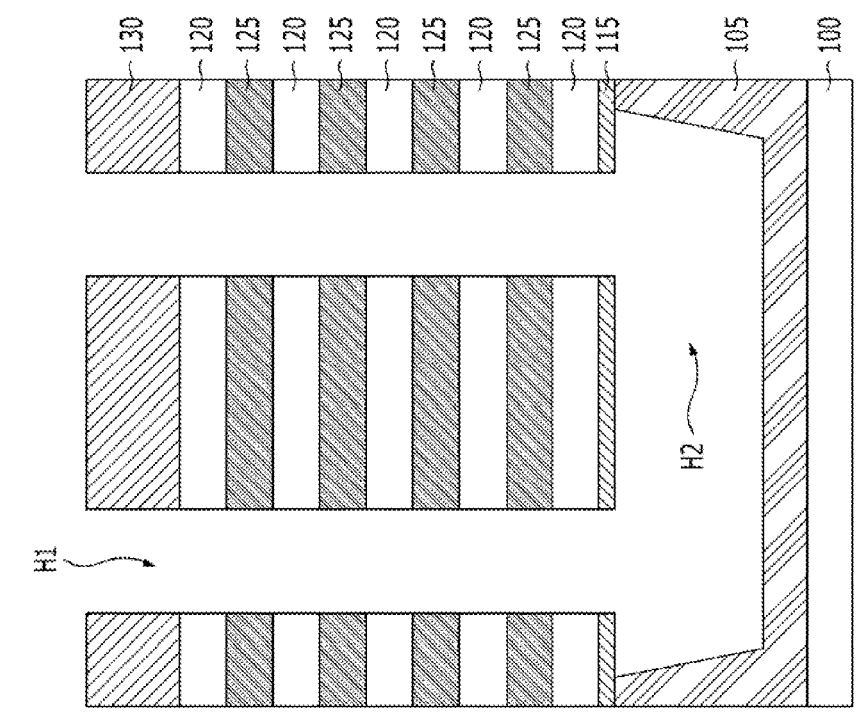

Referring to FIG. 1C, a pair of main channel holes H1 through which the sacrificial pattern 110 is exposed are formed by selectively etching the hard mask layer 130, the stack structure, and the second pipe connection gate electrode layer 115. Each of the main channel holes H1 may have a circular or oval shape, when viewed from a plane parallel to the substrate 100, and each of pairs of the main channel holes H1 may be disposed in each sacrificial pattern 110.

The sacrificial pattern 110 exposed through the pair of main channel holes H1 is removed. In order to remove the sacrificial pattern 110, a wet etch process using an etch selectivity with the first and the second pipe connection gate electrode layers 105 and 115 and the stack structure may be performed. As a result of this process, a sub-channel hole H2 that couples the pair of main channel holes H1 is formed in a space from which the sacrificial pattern 110 is removed.

Referring to FIG. 1D, a preliminary charge trap layer 135 is formed on the inner walls of the pair of main channel holes H1 and the sub-channel hole H2. The preliminary charge trap layer 135 may be formed by depositing a material that may be oxidized and nitrified in a subsequent process, for example, silicon. The preliminary charge trap layer 135 may include silicon having a single crystalline, polycrystalline, or amorphous structure.

A tunnel insulating layer 140 is formed on a surface of the preliminary charge trap layer 135. The tunnel insulating layer 140 is for charge tunneling and may be formed by depositing an oxide-based material conformably using, for example, an atomic layer deposition (ALD) or chemical vapor deposition (CVD) method.

A channel layer 145 is formed on a surface of the tunnel insulating layer 140. The channel layer 145 may be formed by depositing a semiconductor material, such as polysilicon, and may be divided into main channel layers within the main channel holes H1 and a sub-channel layer within the sub-channel hole H2. In particular, the main channel layers may be used as the channels of memory cells or select transistors, and the sub-channel layer may be used as the channel of a pipe connection transistor. Meanwhile, in the present exemplary embodiment, the channel layer 145 may be formed to a thickness that fully fills the main channel holes H1 and the sub-channel hole H2, but the present invention is not limited thereto. In another embodiment, the channel layer 145 may be formed to a thickness that does not fully fill the main channel holes H1 and the sub-channel hole H2.

Figure 1E:
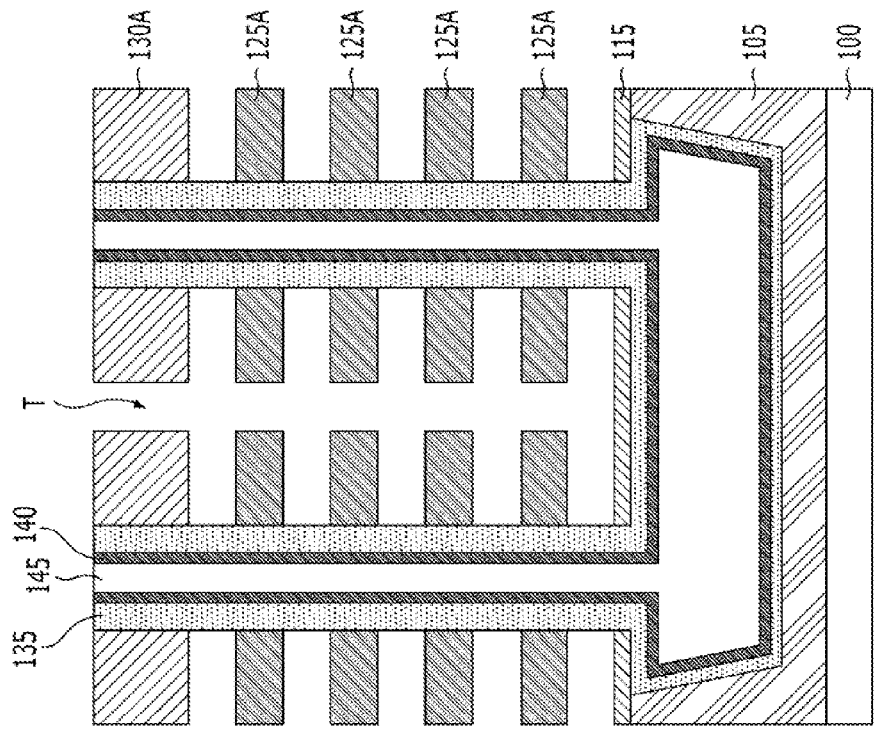

Referring to FIG. 1E, a trench T that separates the first interlayer insulating layers 120 and the sacrificial layers 125 is formed by selectively etching the hard mask layer 130 and the stack structure on both sides of the main channel hole H1.

A plurality of the trenches T may be arranged in parallel in the form of a slit that extends in a direction crossing the cross section. The separated first interlayer insulating layers 120, the separated sacrificial layers 125, and the separated hard mask layers 130 are called first interlayer insulating layer patterns 120A, sacrificial layer patterns 125A, and hard mask layer patterns 130A, respectively.

Figure 1F:
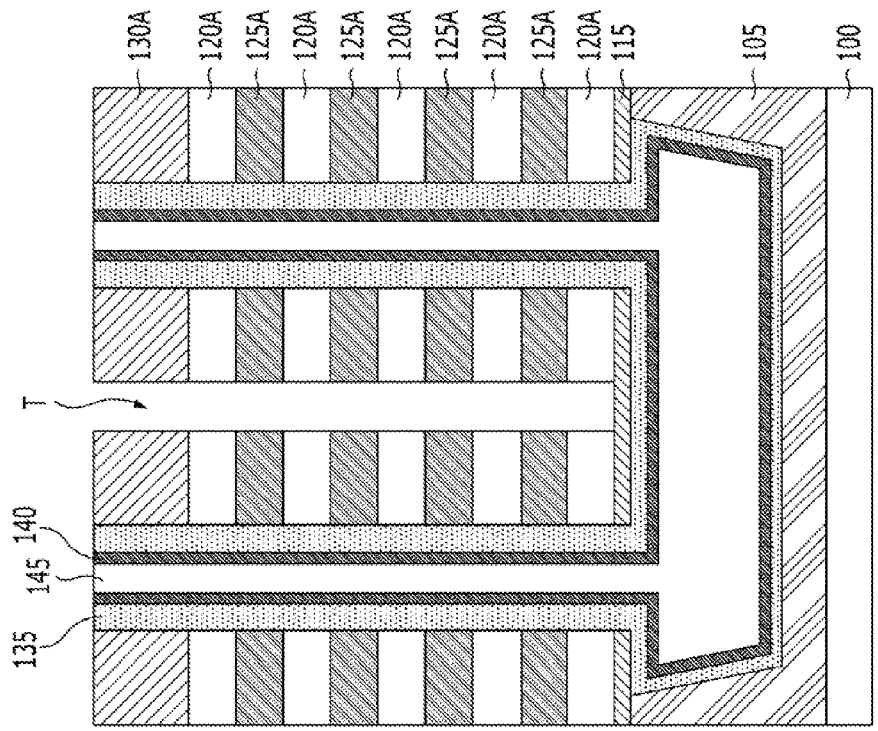
Figure 1M:
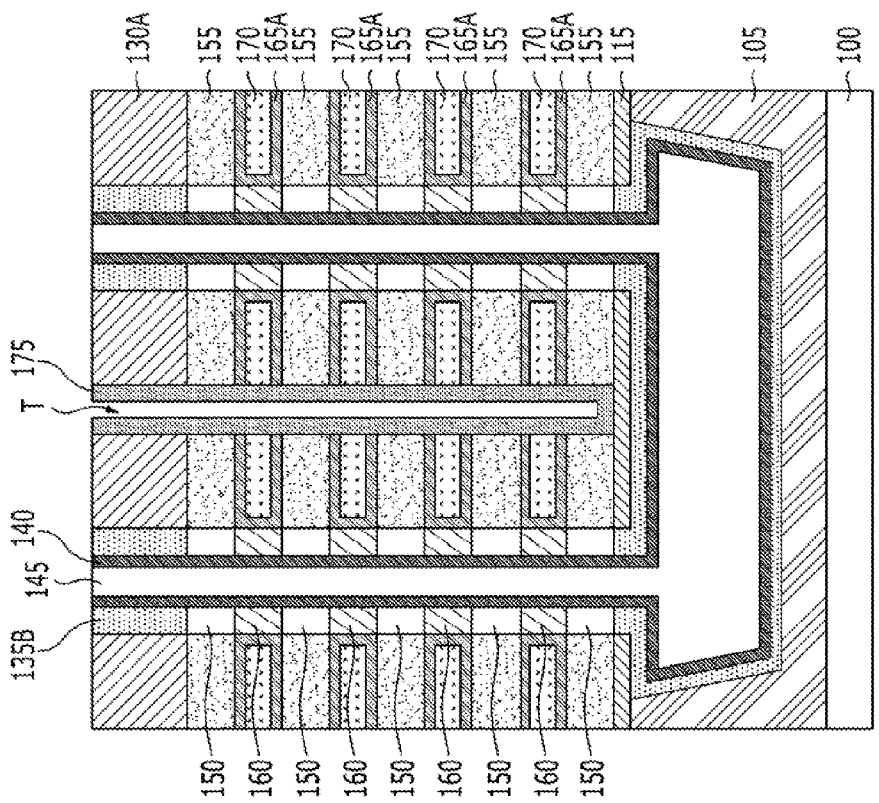

Referring to FIG. 1F, the first interlayer insulating layer patterns 120A exposed by the trench T are removed. In order to remove the first interlayer insulating layer patterns 120A, a wet etch process of a dip-out method using an etch selectivity with the sacrificial layer patterns 125A and the hard mask layer patterns 130A may be performed.

Referring to FIG. 1G, insulating oxide layers 150 are formed by selectively oxidizing the exposed preliminary charge trap layer 135 because the first interlayer insulating layer patterns 120A is removed. The preliminary charge trap layer 135 may be oxidized by plasma oxidation processing. The preliminary charge trap layers 135 separated by layers as a result of this process are called preliminary charge trap layer-primary patterns 135A.

Referring to FIG. 1H, second interlayer insulating layers 155 are formed in the spaces from which the first interlayer insulating layer patterns 120A is removed. The second interlayer insulating layers 155 may be formed by depositing a material having an etch rate different from an etch rate of the sacrificial layer patterns 125A, for example, an oxide-based material, to a thickness that fills the spaces from which the first interlayer insulating layer patterns 120A is removed and then etching the material until the sides of the sacrificial layer patterns 125A are exposed through the trench T.

Referring to FIG. 1I, the sacrificial layer patterns 125A exposed by the trench T are removed. In order to remove the sacrificial layer patterns 125A, a wet etch process of a dip-out method using an etch selectivity with the second interlayer insulating layers 155 and the hard mask layer patterns 130A may be performed.

Referring to FIG. 1J, charge trap layer patterns 160 are formed by nitrifying the preliminary charge trap layer-primary patterns 135A exposed because the sacrificial layer patterns 125A is removed. Here, the preliminary charge trap layer-primary patterns 135A may be nitrified by plasma nitridation processing, and the remaining preliminary charge trap layer-primary patterns 135A are called preliminary charge trap layer-secondary patterns 135B.

Referring to FIG. 1K, a charge blocking layer 165 is formed on the inner walls of the spaces from which the sacrificial layer patterns 125A is removed through the trench T. The charge blocking layer 165 functions to block charges, and store in the charge trap layer patterns 160. The charge blocking layer 165 may be formed by conformably depositing an oxide-based material using, for example, an ALD or CVD method.

Referring to FIG. 1L, the gate electrodes 170 are formed in the spaces from which the sacrificial layer patterns 125A have been removed. The gate electrodes 170 may be formed by the following process.

First, a conductive layer (not shown) for the gate electrodes is formed to a thickness that fills the spaces from which the sacrificial layer patterns 125A is removed by conformably depositing a conductive material, for example, metal or metal nitride, using an ALD or CVD method. The conductive layer for the gate electrodes is etched until the sides of the second interlayer insulating layers 155 are exposed so that conductive layer for the gate electrodes is separated for each layer, which leads to the formation of the gate electrode 170 between the second interlayer insulating layers 155. Meanwhile, the charge blocking layer 165 may also be separated for each layer as a result of this process, and the separated charge blocking layers 165 are called a charge blocking layer pattern 165A.

Referring to FIG. 1M, an insulating layer 175 is formed in the trench T. The insulating layer 175 may be formed by depositing an oxide-based or nitride-based material on the inner wall of the trench T using an ALD or CVD method.

In accordance with the above-described fabrication method, the nonvolatile memory device in accordance with the first embodiment of the present invention, such as that shown FIG. 1M, may be fabricated.

Referring to FIG. 1M the nonvolatile memory device in accordance with the first embodiment of the present invention may include the pipe connection gate electrode formed over the substrate 100, the channel layer 145 configured to include the sub-channel layer formed within the pipe connection gate electrode and a pair of the main channel layers connected to the sub-channel layer and extended in a direction substantially perpendicular to the substrate 100, the plurality of second interlayer insulating layers 155 and the plurality of gate electrodes 170 alternately stacked along the main channel layers, the tunnel insulating layer 140 configured to surround the channel layer 145, the charge trap layer patterns 160 interposed between the gate electrodes 170 and the tunnel insulating layer 140, the charge blocking layer patterns 165A each interposed between the second interlayer insulating layer 155 and the gate electrode 170, and between the gate electrode 170 and the charge trap layer pattern 160, and the insulating oxide layers 150 each interposed between the charge trap layer patterns 160.

Here, the pipe connection gate electrode may include the first and the second pipe connection gate electrode layers 105 and 115 that are separated for each block, and the channel layer 145 may have a U shape. Furthermore, the gate electrodes 170 may surround the sides of the main channel layers and also extend in a direction crossing the cross section. In particular, the charge trap layer pattern 160 functions to store data by trapping charges and may include, for example, a silicon nitride layer. The charge trap layer pattern 160 may be separated by the insulating oxide layers 150 for each memory cell.

Figure 2A:
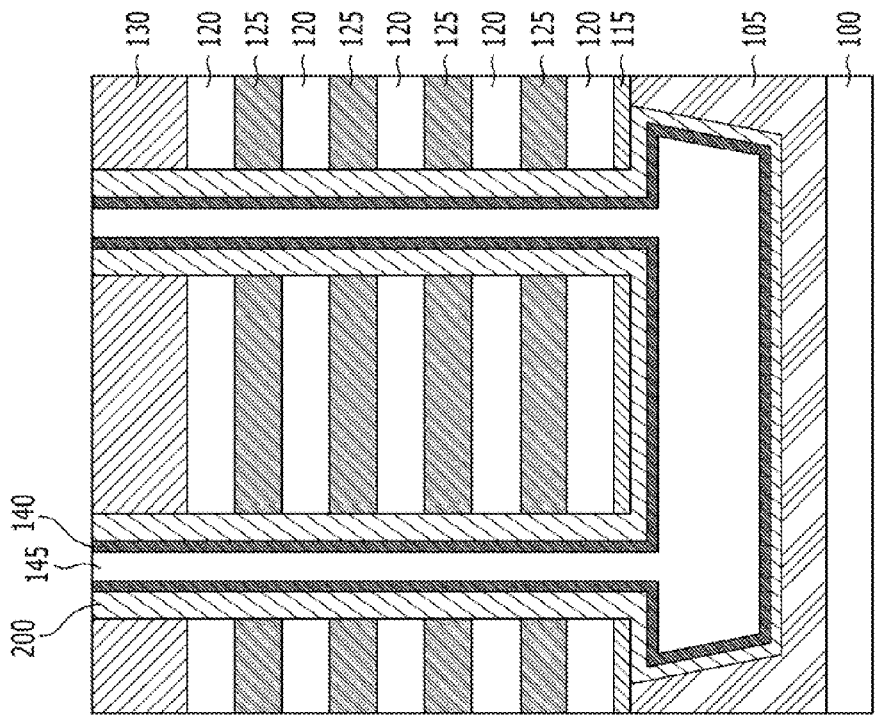

FIGS. 2A to 2I are cross-sectional views illustrating nonvolatile memory device and a method for fabricating the same in accordance with a second embodiment of the present invention. In describing the present embodiment, a description of parts that are substantially the same as those of the first embodiment is omitted, for simplicity. Like in the first embodiment, the processes of FIGS. 1A to 1C are first performed, and a process of FIG. 2A is performed.

Referring to FIG. 2A, a preliminary charge trap layer 200 is formed on the inner walls of the pair of main channel holes H1 and the sub-channel hole H2. The preliminary charge trap layer 200 may be formed by depositing a material that may store data by trapping charges, for example, a nitride-based material.

A tunnel insulating layer 140 is formed on a surface of the preliminary charge trap layer 200, and a channel layer 145 is formed on a surface of the tunnel insulating layer 140. The tunnel insulating layer 140 is for charge tunneling and may be formed by depositing, for example, an oxide-based material, conformably. The channel layer 145 may be formed by depositing a semiconductor material, such as polysilicon.

Figure 2C:
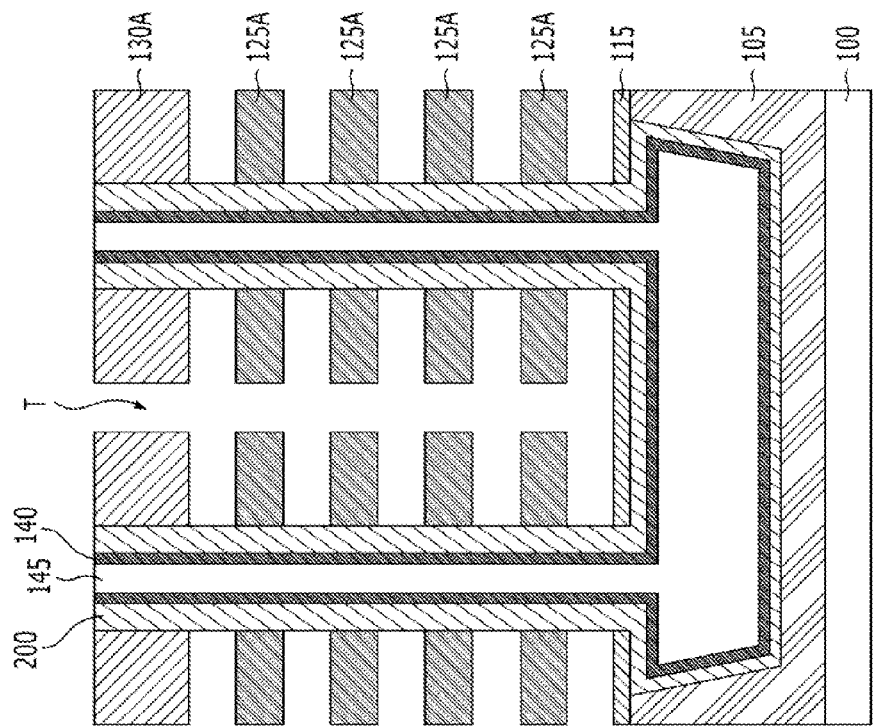
Figure 2B:
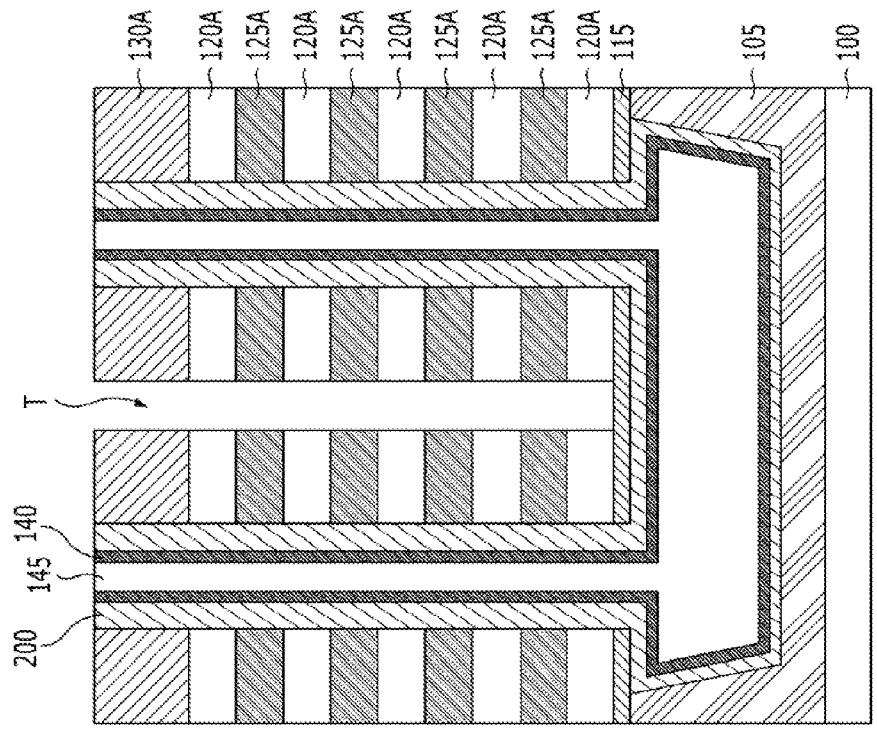

Referring to FIG. 2B, a trench T that separates the first interlayer insulating layers 120 and the sacrificial layers 125 is formed by selectively etching the hard mask layer 130 and the stack structure on both sides of the main channel hole H1. A plurality of the trenches T may be arranged in the form of a slit that extends in a direction crossing the cross section. The separated first interlayer insulating layers 120, the separated sacrificial layers 125, and the separated hard mask layers 130 are called first interlayer insulating layer patterns 120A, sacrificial layer patterns 125A, and hard mask layer patterns 130A, respectively.

Referring to FIG. 2C, the first interlayer insulating layer patterns 120A exposed by the trench T are removed. In order to remove the first interlayer insulating layer patterns 120A a wet etch process of a dip-out method using an etch selectivity with the sacrificial layer patterns 125A and the hard mask layer patterns 10A may be performed.

Figure 2E:
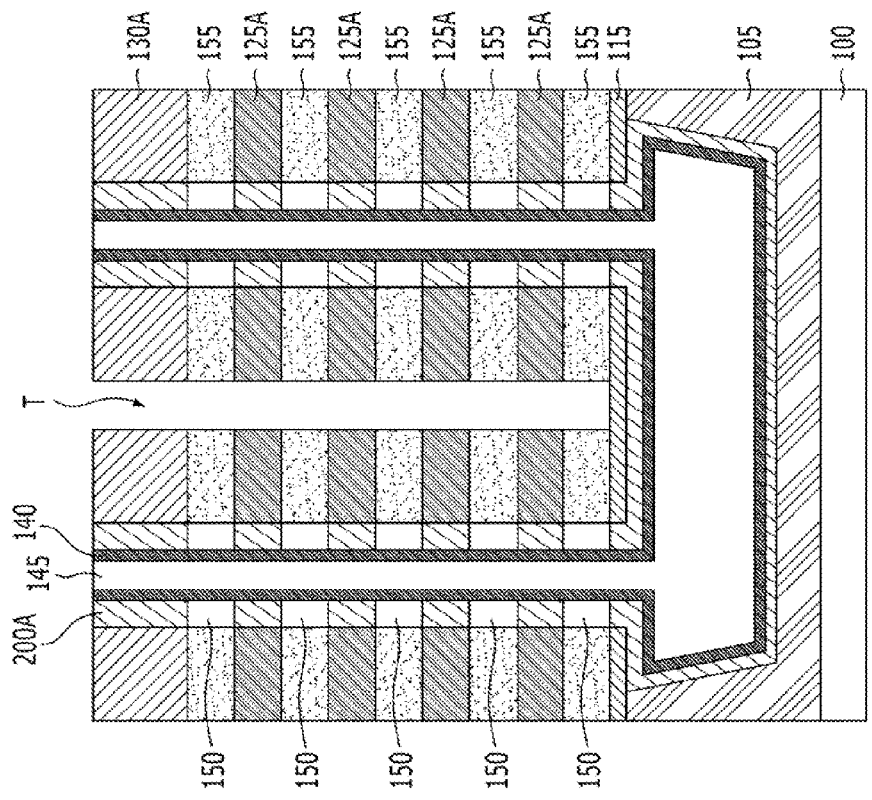
Figure 2D:
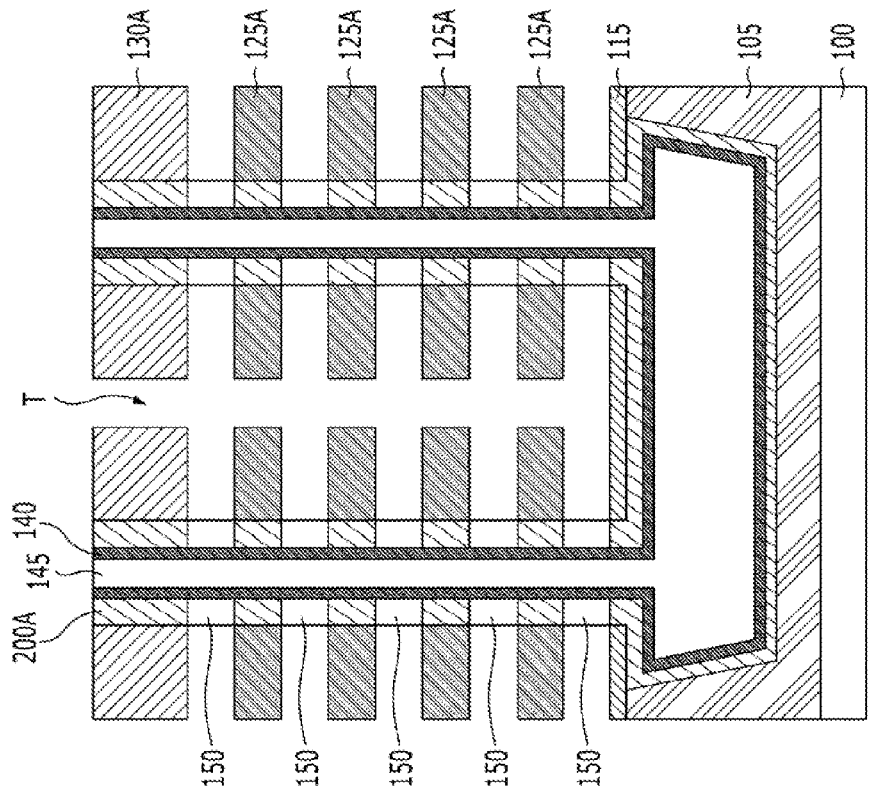

Referring to FIG. 2D, insulating oxide layers 150 are formed by selectively oxidizing the exposed preliminary charge trap layer 200 because the first interlayer insulating layer patterns 120A are removed. Here, the preliminary charge trap layer 200 may be oxidized by plasma oxidation processing. As a result of this process, the preliminary charge trap layer 200 is separated for each layer, which leads to the formation of the charge trap layer patterns 200A.

Referring to FIG. 2E, second interlayer insulating layers 155 are formed in the spaces from which the first interlayer insulating layer patterns 120A are removed. The second interlayer insulating layers 155 may be formed by depositing a material having an etch rate different from an etch rate of the sacrificial layer patterns 125A, for example, an oxide-based material.

Referring to FIG. 2F, the sacrificial layer patterns 125A exposed by the trench T are removed. In order to remove the sacrificial layer patterns 125A, a wet etch process of a dip-out method using an etch selectivity with the second interlayer insulating layers 155 and the hard mask layer patterns 130A may be performed.

Referring to FIG. 2G, a charge blocking layer 165 is formed on the inner walls of the spaces from which the sacrificial layer patterns 125A is removed through the trench T. The charge blocking layer 165 functions to block charges, and store in the charge trap layer patterns 200A. The charge blocking layer 165 may be formed by depositing, for example, an oxide-based material, conformably.

Figure 2I:
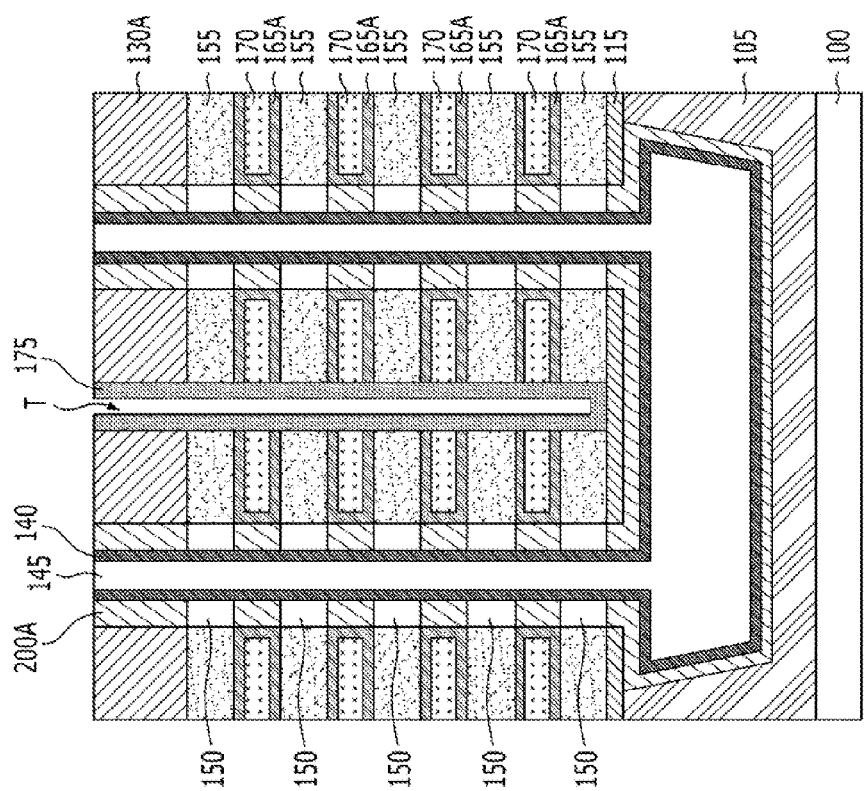
Figure 2H:
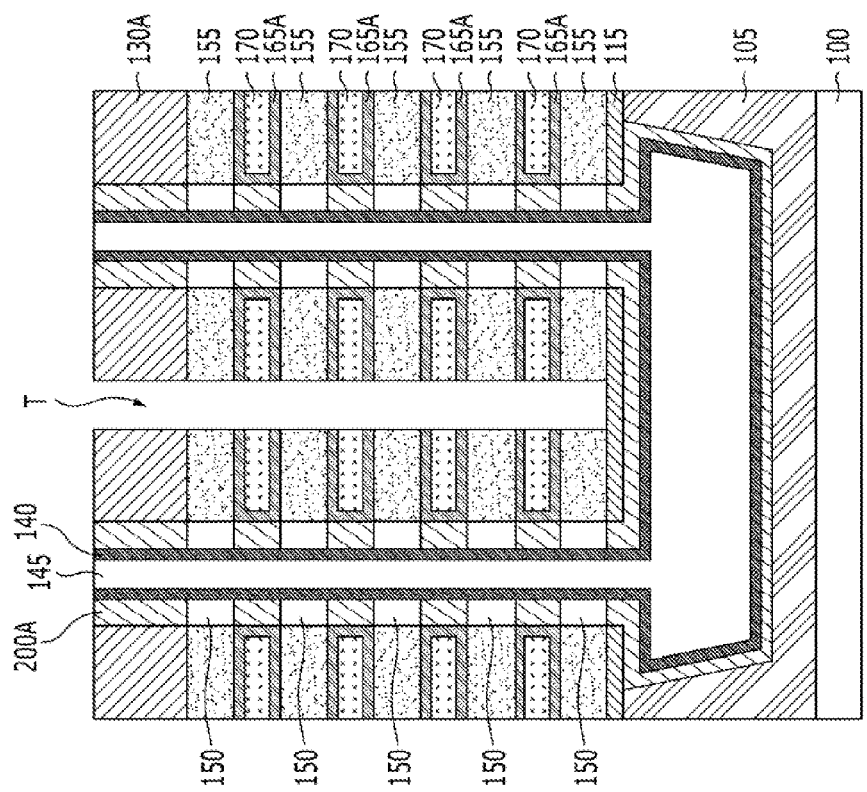

Referring to FIG. 2H, gate electrodes 170 are formed in the spaces from which the sacrificial layer patterns 125A are removed. The gate electrodes 170 may be formed by conformably depositing a conductive material, such as metal or metal nitride, to a thickness that fills the spaces from which the sacrificial layer patterns 125A are removed and then etching the material until the sides of the second interlayer insulating layers 155 are exposed. Meanwhile, the charge blocking layers 165 separated for each layer as a result of this process are called charge blocking layer patterns 165A.

Referring to FIG. 2I, an insulating layer 175 is formed within the trench T. The insulating layer 175 may be formed by depositing an oxide or nitride-based material on the inner wall of the trench T using an ALD or CVD method.

The second embodiment is different from the first embodiment in that the charge trap layer patterns 200A may be formed without an additional nitridation process, because the preliminary charge trap layer 200 includes a nitride-based material.

In accordance with the nonvolatile memory devices and the methods for fabricating the same in accordance with the embodiments of the present invention, the spread of charges may be prevented by separating the charge trap layers for storing data by trapping charges for each memory cell. Accordingly, interference between memory cells may be minimized, a data retention characteristic may be improved, and the reliability of a nonvolatile memory device may be improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, comprising:
   forming a structure having a plurality of first interlayer insulating layers and a plurality of sacrificial layers alternately stacked over a substrate;
   forming main channel holes configured to penetrate the structure;
   sequentially forming a preliminary charge trap layer, a tunnel insulating layer, and a channel layer on inner walls of the main channel holes;
   forming a trench configured to penetrate the plurality of sacrificial layers on both sides of each of the main channel holes; and
   forming insulating oxide layers by oxidizing the preliminary charge trap layer on inner sides of the first interlayer insulating layers.

2. The method of claim 1, wherein the preliminary charge trap layer is separated by the insulating oxide layers for each cell.

3. The method of claim 1, wherein the preliminary charge trap layer comprises silicon.

4. The method of claim 1, wherein the preliminary charge trap layer comprises a nitride-based material.

5. The method of claim 1, wherein the forming of the insulating oxide layer comprises:
   removing the first interlayer insulating layers exposed by the trench;
   oxidizing the preliminary charge trap layer exposed by removal of the first interlayer insulating layers; and
   forming second interlayer insulating layers in spaces that the first interlayer insulating layers are removed.

6. The method of claim 1, wherein the sacrificial layers comprise a material having an etch rate different from an etch rate of the first interlayer insulating layers.

7. The method of claim 1, further comprising:
   removing the sacrificial layers exposed by the trench, after forming the insulating oxide layers; and
   sequentially forming charge blocking layers and gate electrodes in spaces that the sacrificial layers are removed.

8. The method of claim 3, further comprising:
   moving the sacrificial layers exposed by the trench, after forming the insulating oxide layers; and
   nitrifying the preliminary charge trap layer exposed by removal of the sacrificial layers.

9. The method of claim 5, wherein the second interlayer insulating layers comprise a material having an etch rate different from an etch rate of the sacrificial layers.

10. The method of claim 7, further comprising forming an insulating layer within the trench, after forming the gate electrodes.

11. A method for fabricating a nonvolatile memory device, comprising:
   forming a pipe connection gate electrode, having a sacrificial pattern, over a substrate;
   forming a structure having a plurality of first interlayer insulating layers and a plurality of sacrificial layers alternately stacked over the pipe connection gate electrode;
   forming a pair of main channel holes through which the sacrificial pattern is exposed by selectively etching the structure;
   forming a sub-channel hole configured to couple with the pair of main channel holes by removing the sacrificial pattern;
   sequentially forming a preliminary charge trap layer, a tunnel insulating layer, and a channel layer on inner walls of the pair of main channel holes and the sub-channel hole;
   forming a trench configured to penetrate the plurality of sacrificial layers on both sides of each of the pair of the main channel holes; and
   forming insulating oxide layers by oxidizing the preliminary charge trap layer on inner sides of the first interlayer insulating layers.

12. The method of claim 11, wherein the preliminary charge trap layer is separated by the insulating oxide layers for each cell.

13. The method of claim 11, wherein the preliminary charge trap layer comprises silicon.

14. The method of claim 11, wherein the preliminary charge trap layer comprises a nitride-based material.

15. The method of claim 11, herein the forming of the insulating oxide layer comprises:
   removing the first interlayer insulating layers exposed by the trench;
   oxidizing the preliminary charge trap layer exposed by removal of the first interlayer insulating layers; and
   forming second interlayer insulating layers in spaces that the first interlayer insulating layers are removed.

16. The method of claim 11, wherein the sacrificial layers comprise a material having an etch rate different from an etch rate of the first interlayer insulating layers.

17. The method of claim 11, further comprising:
removing the sacrificial layers exposed by the trench, after forming the insulating oxide layers; and
sequentially forming charge blocking layers and gate electrodes in spaces that the sacrificial layers are removed.

18. The method of claim 13, further comprising:
removing the sacrificial layers exposed by the trench, after forming the insulating oxide layers; and
nitrifying the preliminary charge trap layer exposed by removal of the sacrificial layers.

19. The method of claim 15, wherein the second interlayer insulating layers comprise a material having an etch rate different from an etch rate of the sacrificial layers.

20. The method of claim 17, further comprising forming an insulating layer in the trench, after forming the gate electrode.

* * * * *